US007408136B2

(12) United States Patent
Bechtel et al.

(10) Patent No.: US 7,408,136 B2
(45) Date of Patent: *Aug. 5, 2008

(54) VEHICLE VISION BASED SYSTEMS HAVING IMPROVED LIGHT SOURCE DISTINGUISHING FEATURES

(75) Inventors: Jon H. Bechtel, Holland, MI (US);
Joseph S. Stam, Holland, MI (US);
John K. Roberts, East Grand Rapids, MI (US)

(73) Assignee: GENTEX Corporation, Zeeland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/143,150

(22) Filed: Jun. 2, 2005

(65) Prior Publication Data
US 2005/0218298 A1 Oct. 6, 2005

Related U.S. Application Data

(60) Continuation of application No. 10/640,851, filed on Aug. 14, 2003, now Pat. No. 6,924,470, which is a continuation of application No. 09/952,521, filed on Sep. 12, 2001, now Pat. No. 6,653,615, which is a continuation of application No. 09/677,906, filed on Oct. 3, 2000, now Pat. No. 6,291,812, which is a division of application No. 09/093,993, filed on Jun. 9, 1998, now Pat. No. 6,130,421.

(51) Int. Cl.
*H01L 27/00* (2006.01)
*B60Q 1/02* (2006.01)
(52) U.S. Cl. .................. 250/208.1; 315/82; 250/205
(58) Field of Classification Search ............. 250/208.1, 250/226, 205; 701/36; 315/82
See application file for complete search history.

(56) References Cited

U.S. PATENT DOCUMENTS

| 4,667,092 | A | * | 5/1987 | Ishihara | 250/216 |
| 4,808,808 | A | * | 2/1989 | Karasaki et al. | 250/201.2 |
| 5,132,802 | A | * | 7/1992 | Osthues et al. | 348/262 |
| 5,537,003 | A | * | 7/1996 | Bechtel et al. | 315/82 |
| 5,796,094 | A | * | 8/1998 | Schofield et al. | 250/208.1 |
| 5,998,929 | A | * | 12/1999 | Bechtel et al. | 315/82 |
| 6,130,421 | A | * | 10/2000 | Bechtel et al. | 250/208.1 |
| 6,291,812 | B1 | * | 9/2001 | Bechtel et al. | 250/208.1 |
| 6,653,615 | B2 | * | 11/2003 | Bechtel et al. | 250/208.1 |
| 6,924,470 | B2 | * | 8/2005 | Bechtel et al. | 250/208.1 |

* cited by examiner

*Primary Examiner*—Thanh X Luu
(74) *Attorney, Agent, or Firm*—James E. Shultz, Jr.

(57) ABSTRACT

An imaging system for use in a vehicle headlamp control system includes an opening, an image sensor, a red lens blocking red complement light between the opening and the image sensor, and a red complement lens blocking red light between the opening and the image sensor. Each lens focuses light onto a different subwindow of the image sensor. The imaging system allows processing and control logic to detect the presence of headlamps on oncoming vehicles and tail lights on vehicles approached from the rear for the purpose of controlling headlamps. A light sampling lens may be used to redirect light rays from an arc spanning above the vehicle to in front of the vehicle into substantially horizontal rays. The light sampling lens is imaged by the image sensor to produce an indication of light intensity at various elevations. The processing and control logic uses the light intensity to determine whether headlamps should be turned on or off. A shutter may be used to protect elements of the imaging system from excessive light exposure.

11 Claims, 7 Drawing Sheets

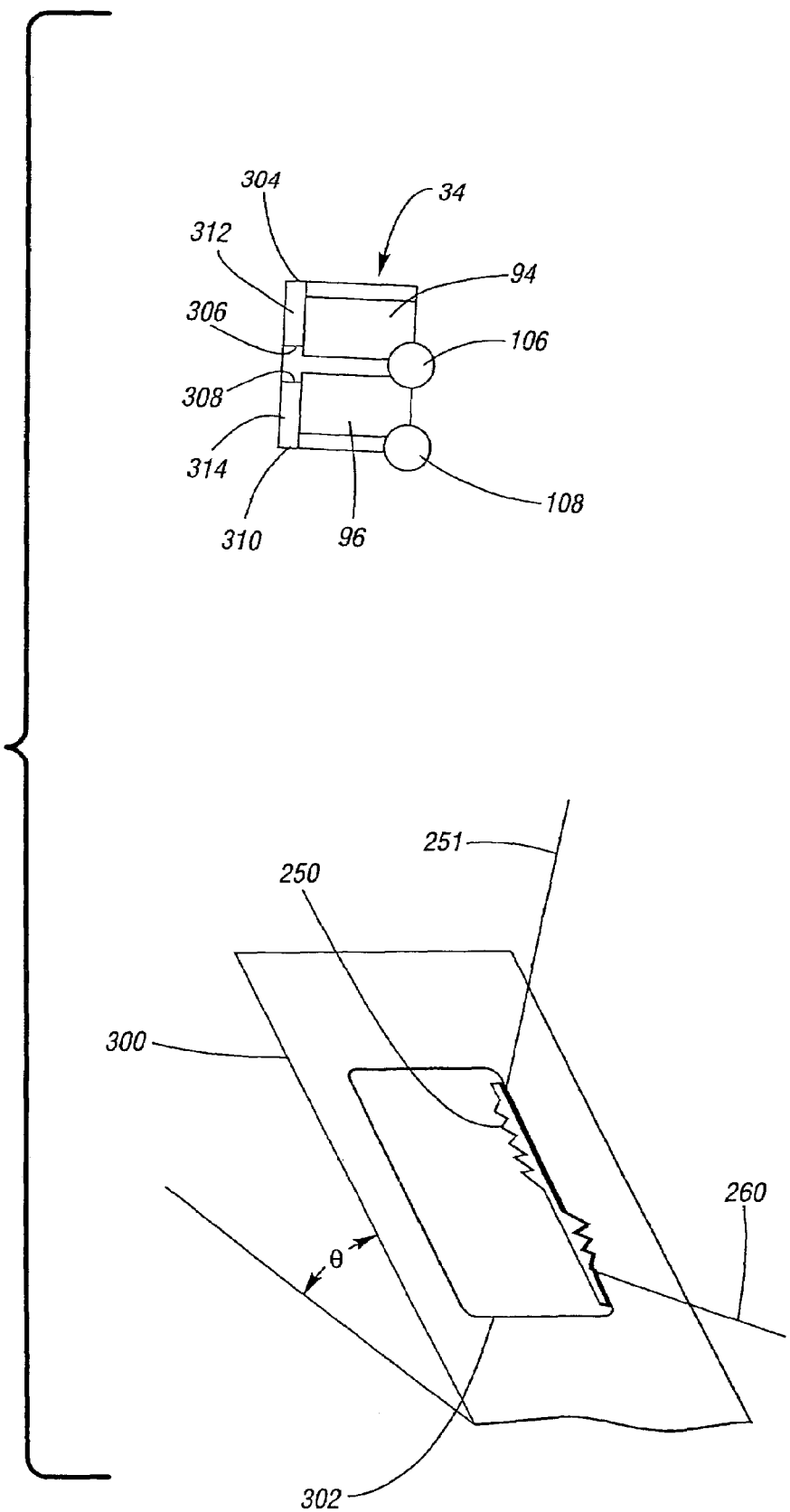

VEHICLE VISION BASED SYSTEMS HAVING IMPROVED LIGHT SOURCE DISTINGUISHING FEATURES

CROSS-REFERENCE TO RELATED APPLICATIONS

This application is a continuation of U.S. patent application Ser. No. 10/640,851, entitled "IMAGING SYSTEM FOR VEHICLE HEADLAMP CONTROL," filed on Aug. 14, 2003, which is a continuation of U.S. patent application Ser. No. 09/952,521, entitled "IMAGING SYSTEM FOR VEHICLE HEADLAMP CONTROL," filed on Sep. 12, 2001, now U.S. Pat. No. 6,653,615, which is a continuation of U.S. patent application Ser. No. 09/677,906, entitled "IMAGING SYSTEM FOR VEHICLE HEADLAMP CONTROL," filed on Oct. 3, 2000, now U.S. Pat. No. 6,291,812, which is a divisional of U.S. patent application Ser. No. 09/093,993, entitled "IMAGING SYSTEM FOR VEHICLE HEADLAMP CONTROL," filed on Jun. 9, 1998, now U.S. Pat. No. 6,130,421. The entire disclosures of each of the above applications are incorporated herein by reference.

BACKGROUND OF THE INVENTION

The present invention relates to imaging systems for use in a control system such as a vehicle headlamp control.

Headlamps illuminate a region in front of a vehicle allowing a driver to view the region when ambient light is insufficient. Headlamps also allow the vehicle to be seen by pedestrians and drivers of other vehicles. High beam headlamps provide even greater illumination and have a greater coverage region. However, high beam headlamps may blind drivers in oncoming vehicles and drivers in vehicles traveling in the same direction within the high beam coverage region. Traditionally, a driver has had to manually control turning headlamps on and off and switching between high beam and low beams.

One difficulty with manual control is that the driver may forget to turn headlamps on at dusk making the vehicle difficult to see. Another difficulty is that the driver may neglect to dim high beam headlamps for oncoming traffic or when approaching another vehicle from behind.

Previous attempts to automatically control the operation of vehicle headlamps have used sensors which provide a single output signal or a very small number of output signals to the associated control system. For example, a single output sensor has been used to sense ambient light for determining when to turn headlamps on or off. Also, a single output sensor has been used for determining when to dim automotive headlamps. Whereas a headlamp on/off control using a single sensor input has achieved limited success in automotive applications, a single sensor headlamp dimmer control is not currently offered because of its many shortcomings.

Array imaging sensors and various scanning techniques have been proposed, but even with the reduced costs made possible by today's electronics, these sensors and techniques have not produced satisfactory headlamp dimming and on/off control functions. Such sensing systems typically have hundreds of rows and columns of pixel sensors generating hundreds of thousands or even millions of pixels. At a typical video rate of 30 frames per second, this requires conversion and data processing rates in the millions of operations per second.

Headlamp on/off control can be based on ambient light levels. Headlamp dimmer control can be based on recognizing the headlamps from oncoming vehicles and the tail lamps of vehicles approached from behind. Since the resolution required to detect ambient light levels and to detect headlamps and tail lights is less than required for traditional images, a smaller imaging array, and hence, slower processing electronics, may be used.

In order to distinguish red tail lamps from other lights, the imaging system must produce readings in at least two different color bands. The first of two methods usually used to sense colors with an image sensor has been to cover one-third of the pixel sensing sights in the imager with a red or red complement filter, one-third of the pixels with a blue or blue complement filter, and one-third of the pixels with a green or green complement filter. This is often done, for example, by placing alternating red, green, and blue stripes over columns of pixels. Each pixel site registers one color and interpolation is used to supply the two missing colors at each pixel sight.

When coupled with a low resolution imager, this technique for sensing color creates a problem. Due to the optics used, the projected image of a headlamp or tail light viewed by the imaging sensing array is very small, probably smaller than the resolving power of the lens. This projected image will be referred to as a dot. When pixel spacing is significantly smaller than the dot size projected by the lens, a portion of a dot of a particular color may not always strike a sensor sight of that color. As the pixel size or area of optical coverage per pixel is increased due to a corresponding reduction in the number of pixels, the voids between the like colored pixel sights become larger unless a complicated interdigitated pixel pattern is used. Even if readout of a particular color is not completely lost by having the entire dot image projected on a pixel of another color or colors, the readout will be coarse depending on what portion of the dot strikes a pixel. Since distinguishing a color is usually a matter of determining balance between two or more color components and not just determining the presence or absence of a particular color component, when the small spot of light in the projected image of a headlamp or tail light falls more on one pixel of one color than another, the measured balance is altered accordingly.

A further disadvantage with this method results from dyes used to implement the color filters. The dyes are normally organic and are subject to degradation from thermal and light exposure. Since the dye sits directly over individual pixel sites, the energy from a strong light source, such as the sun, is focused by the lens system directly onto the dye.

A still further problem with this method is that having the color filter dye applied to and precisely registered with the pixel sensor sight on the image sensor is expensive. The cost of adding color filters directly on the pixel sensor may be as expensive as the silicon image sensing chip itself.

A second method for imaging color splits light from the image into red, green, and blue components which are projected onto separate image sensors, each of which measures its respective color filtered image. This requires a complicated optical arrangement and three separate image sensors. The color separation technique often utilizes mirrors which selectively reflect one color and transmit the complementary color. These optical arrangements normally require widely separated non-planar image sensor sights making it difficult, if not impractical, to place the three sensors on a common silicon substrate or even in a common package. This technique presents a three-fold problem. A single sensor array cannot be used, a single silicon chip cannot be used, and a single package cannot be used.

What is needed is a cost effective imaging system to be used in, for example, a headlamp control system. To limit costs and complexity in the optics, the sensor array, the processor, and processor interface, a minimal number of pixels, preferably in a range which would be considered too small for satisfactory pictorial image presentation, should be used. The imaging system should not use spectral filtering that would place dyes or color-selecting materials in the focal point of the lens system. The imaging system should supply signals appropriate for determining headlamp dimming control, headlamp on/off control, or both. The imaging system should also be protected against excessive light or heat damage.

SUMMARY OF THE INVENTION

A further object of the present invention is to produce different color components of a scene using an optical system that does not place filters in the focal plane of the optical system.

In carrying out the above objects and other objects and features of the present invention, an imaging system is provided for use in a vehicle headlamp control system. The imaging system includes a housing defining an opening, the opening generally towards a scene, an image sensor within the housing opposite from the opening, a first lens to focus light from the scene onto a first portion of the image sensor, and a second lens to focus light from the scene onto a second portion of the image sensor, the second portion of the image sensor separate from the first portion.

In one embodiment, the first lens focuses light at a first wavelength onto the image sensor and the second lens focuses light at a second wavelength onto the image sensor. In a refinement, the focal length of the first lens at the first wavelength is substantially the same as the focal length of the second lens at the second wavelength. In a preferred embodiment, the first lens attenuates light substantially cyan in color and the second lens attenuates light substantially red in color.

In another embodiment, the image sensor has a low resolution.

In yet another embodiment, a baffle extends from an area between the first lens and the second lens towards the image sensor. The baffle reduces light passing through the first lens from striking the second portion of the image sensor and reduces light passing through the second lens from striking the first portion of the image sensor.

In a further embodiment, the imaging system includes a shutter for reducing the intensity of light entering the opening. In a preferred embodiment, the shutter is an electrochromic window.

In a still further embodiment, a maximum focal length is the largest of the focal length of the first lens and the focal length of the second lens. The housing defines the opening at least two times the maximum focal length away from the first lens and the second lens. In yet a further embodiment, a first portion of the housing defining the opening is positioned to block light which would otherwise travel through the first lens and impinge as stray light on the second portion of the image sensor and a second portion of the housing defining the opening is positioned to block light which would otherwise travel through the second lens and impinge as stray light on the first portion of the image sensor.

An imaging system is also provided that includes a housing defining an opening generally towards a scene in front of a vehicle, an image sensor located within the housing, and a light sampling lens positioned near the opening. The light sampling lens gathers light rays from a region defined by a vertical arc extending from substantially above the opening to substantially in front of the opening, and redirects the gathered light rays towards the image sensor. The lens may gather light rays from a narrow horizontal arc in front of the opening.

In one embodiment, the light sampling lens is further operative to gather light rays from elevationally separate regions and to redirect the gathered light rays from each elevationally separate region to a different set of pixel sensors in the image sensor, allowing the image sensor to detect the light level at different angular elevations. The elevationally separate regions may be regions separated by 10° of elevation.

In another embodiment, the system includes a first subwindow of pixel sensors, a second subwindow of pixel sensors, a red lens within the housing between the light sampling lens and the image sensor for projecting substantially red components of the redirected light rays onto the first subwindow, and a red complement lens within the housing between the light sampling lens and the image sensor, the red complement lens for projecting substantially red complement components of the redirected light rays onto the second subwindow.

A system for controlling at least one headlamp includes a headlamp controller operative to turn the headlamps on and off based on a received on/off control signal, an image sensor comprised of an array of pixel sensors, a lens system operative to gather light rays from a region defined by a vertical arc extending from substantially above the vehicle to substantially in front of the vehicle and to redirect the gathered light rays towards the image sensor, and a processing and control system operative to read light levels from pixel sensors and to determine the on/off control signal based on comparing the light levels to a threshold.

In one embodiment, the processing and control system can determine the threshold based on color components projected onto the first and second subwindows. Alternatively, the processing and control system can determine whether the region defined by the vertical arc images a blue sky or a cloudy sky and to use a lower threshold for the blue sky than for the cloudy sky.

In another embodiment, the processing and control system can determine the on/off control signal based on comparing the light levels to a hysteretic threshold.

In yet another embodiment, the processing and control system can determine the on/off control signal based on a time delay from a previous change in the on/off control signal.

The above objects and other objects, features, and advantages of the present invention are readily apparent from the following detailed description of the best modes for carrying out the invention when taken in connection with the accompanying drawings.

BRIEF DESCRIPTION OF THE DRAWINGS

In the drawings:

FIG. 8 is an illustrative optical system incorporating the lens of FIG. 7.

DETAILED DESCRIPTION OF THE PREFERRED EMBODIMENTS

Figure 1:
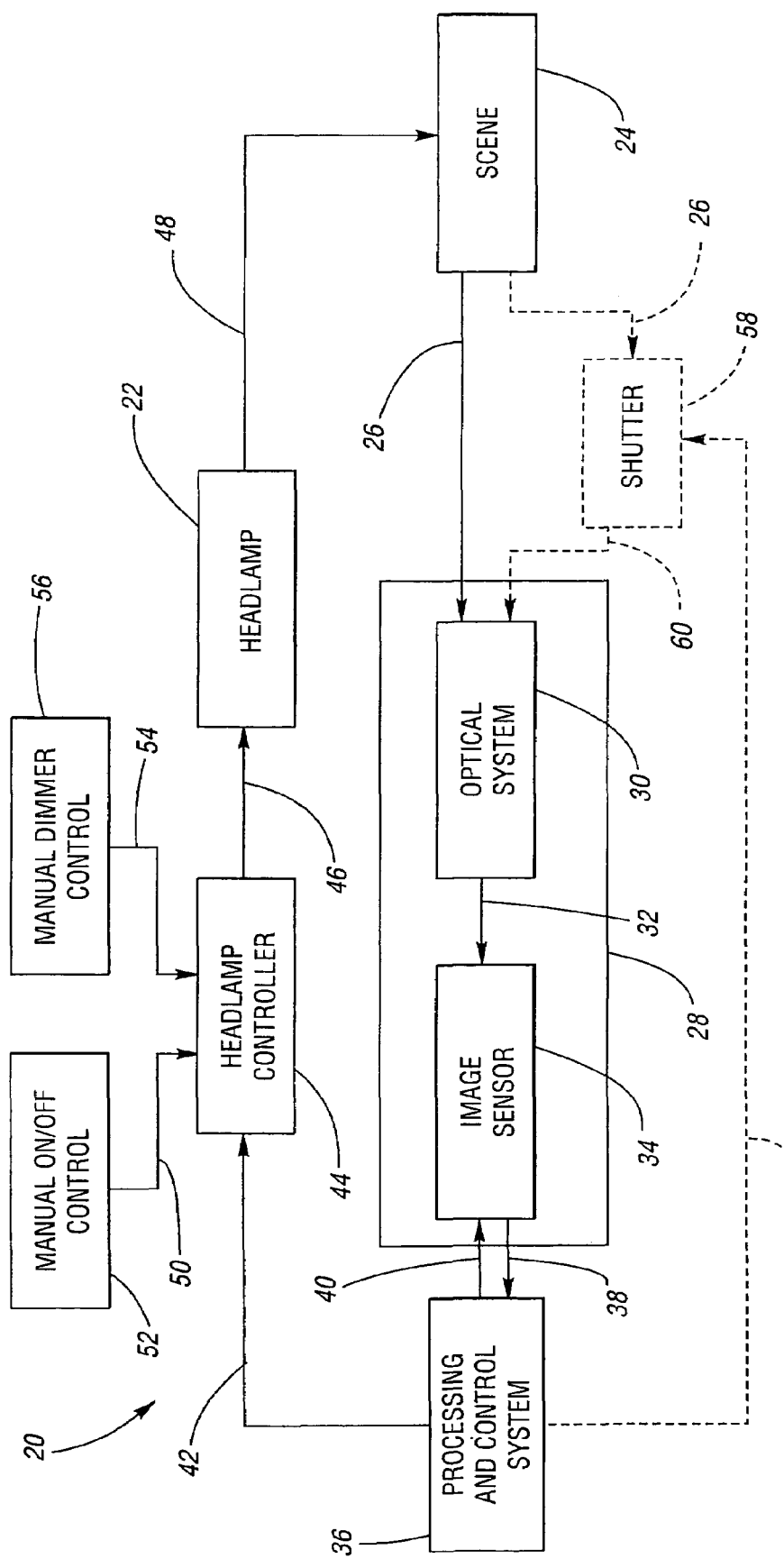
FIG. 1 is a headlamp control system that may use an imaging system according to the present invention.

Referring now to FIG. 1, a block diagram of a system incorporating the present invention is shown. Headlamp control system 20 is used in a vehicle to control one or more of headlamp 22. Control operations may include automatically turning on and off headlamp 22 and automatically switching between the high beam and low beam for headlamp 22.

Scene 24 is generally in front of a vehicle. Light rays 26 from scene 24 enter imaging system 28 by first passing through optical system 30. Focused rays 32 from optical system 30 strike image sensor 34 in the focal plane of optical system 30. Processing and control system 36 receives image sensor output 38 and produces image sensor control 40. Processing and control system 36 also generates automatic headlamp control signal 42 which is received by headlamp controller 44.

Processing and control system 36 may perform continuous cycles to check for the presence of headlamps and tail lights in scene 24. During each cycle, two images are acquired from image sensor 34. As will be described in more detail below, one image has predominantly red components and one image has predominantly red complement components. Bright spots in the red image may indicate the presence of tail lights in scene 24. Bright spots in both the red and red complement images may indicate the presence of headlamps in scene 24. Counters may be used to indicate the number of successive frames for which a bright spot has been detected in approximately the same location. Once the count reaches a threshold value, the bright spot is assumed to be from another vehicle and an appropriate action, such as dimming headlamp 22, is taken. The above description is a simplification of the embodiments described in U.S. Pat. No. 5,837,994 entitled "CONTROL SYSTEM TO AUTOMATICALLY DIM VEHICLE HEAD LAMPS," issued Nov. 17, 1998.

Headlamp controller 44 generates headlamp controller signal 46, which is received by headlamp 22 causing headlamp 22 to turn on or off or to switch between a high beam and low beam. Headlamp 22 may produce headlamp illumination 48, illuminating a portion of scene 24. Headlamp controller 44 may also receive manual on/off signal 50 from manual on/off control 52 and manual dimmer signal 54 from manual dimmer control 56. Manual on/off control 52 and manual dimmer control 56 allow the driver to manually control the operation of headlamps 22. In an alternative embodiment, one or both of headlamp on/off signal 50 and manual dimmer signal 54 may be used by processing and control system 36 to determine the state of headlamp 22.

In an alternative embodiment, shutter 58 is placed before imaging system 28. Shutter 58 then receives light rays 26 from scene 24 and outputs attenuated light rays 60 to optical system 30. Shutter 58 reduces or eliminates the amount of light reaching image sensor 34 when light from scene 24 is excessive such as, for example, at dawn or dusk when the sun is near the horizon. Shutter 58 may be implemented using a mechanical means such as blinds, an iris, or the like, under the control of processing and control system 36 as provided by shutter control signal 62. Alternatively, shutter 58 may be a photosensitive glass or plastic. In a further alternative, shutter 58 may be an electrochromic window as described in U.S. Pat. No. 4,902,108 titled "SINGLE-COMPARTMENT, SELF-ERASING, SOLUTION-PHASE ELECTROCHROMIC DEVICES, SOLUTIONS FOR USE THEREIN, AND USES THEREOF" to H. J. Byker which is hereby incorporated by reference.

Image sensor 34 should include a minimum number of sensing elements to reduce processing requirements and decrease cost. To efficiently use image sensor 34 with a relatively few number of pixel sensors, the projected image of a distant tail light or headlamp in scene 24 should be comparable in size or smaller than that of a single pixel in image sensor 34. The relative intensities of color components calculated from processing the image data from such a projected image should be generally independent of the specific position of the projected image on the array. Therefore, it is desirable to simultaneously project differently filtered images of scene 24 on spatially separate frames preferably within the same pixel array or alternately in separate pixel arrays. The one or more pixel arrays are preferably on the same substrate and in the same package.

A preferred arrangement is to project the separate frames on a common array large enough to include the frames in separate subwindows, and to use common control logic which provides a means to simultaneously expose and process the multiple frames. A control of this type is described in U.S. Pat. No. 5,990,469, entitled "CONTROL CIRCUIT FOR IMAGE ARRAY SENSORS," issued on Nov. 23, 1999, which is hereby incorporated by reference. Descriptions of the image array and lens systems are provided with regards to FIGS. 2 through 8 below.

In a preferred embodiment, when a small area light source is detected, the frame is analyzed to determine the single or the small group of adjoining pixels having illumination levels substantially higher than the background level of the surrounding pixels. The light reading is integrated or summed over this group of pixels with an optional subtraction of the average background level. This process is repeated for the frame corresponding to each color component. In this manner, readings are relatively independent of whether the illumination is contained on one pixel sensor or the illumination strikes a pixel boundary and casts portions of light on two or more adjoining pixel sensors. This technique increases the tolerance for a small registration error between the subwindows for different color components when the ratiometric comparison of the various color components of a given small area light source is made.

Figure 2:
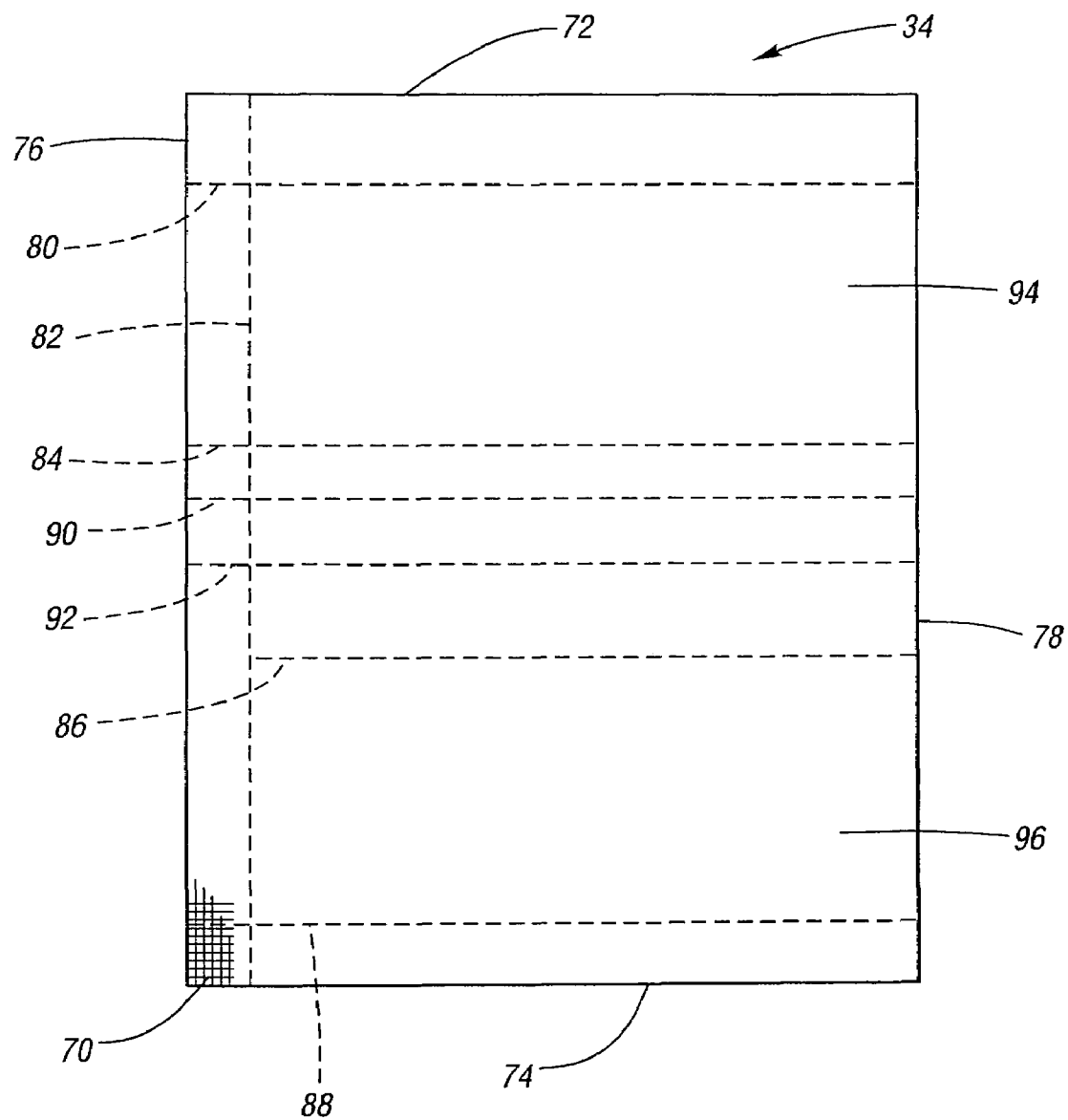
FIG. 2 is a schematic diagram of an image sensor according to the present invention.

Referring now to FIG. 2, a schematic diagram representing an image sensor according to the present invention is shown. Image sensor 34 includes an array of pixel sensors, one of which is indicated by 70 and arranged in rows and columns. In an exemplary embodiment, image sensor 34 includes 80 rows by 64 columns of pixel sensors, most of which are not shown for clarity. Image sensor 34 includes top border 72, bottom border 74, left border 76, and right border 78 defining a region covered by pixel sensors 70. The use of directionality such as, for example, top, bottom, left, and right is provided for ease of explanation, and is not meant to limit the present invention to a particular orientation.

Image sensor 34 is divided into several subwindows. In one embodiment, two subwindows are used to image scene 24 into two color components. Upper subwindow 94 is bounded by lines 78, 80, 82, and 84, and contains pixel sensors 70 struck by an image projected through a lens which is dyed to pass red light. Lower subwindow 96 is bounded by lines 78, 86, 82, and 88, and includes pixel sensors 70 onto which an image is projected through a lens which is dyed to pass cyan or red complement light.

The lenses provide a field of view of scene 24 such as, for example, 22° wide by 9° high. A space between line 80 and top edge 72 and between lines 84 and 90 allows for an elevational adjustment to correct for misalignment of imaging system 28 in the vehicle. To accomplish the adjustment, upper subwindow 94 boundaries, represented by line 80 and line 84 respectively, are moved up or down within the range between top edge 72 and line 90. Similarly, lines 86 and 88 represent boundaries for lower subwindow 96 that may be moved between bottom edge 74 and line 92. In the exemplary embodiment, an elevational adjustment through a range of about 4.8° is allowed. Subwindows 94 and 96 are normally moved upward or downward together but the origin of one relative to the other is also adjustable to compensate for variations in the registration of one subwindow with regards to the other.

Pixel sensors 70 that lie within the region bordered by lines 90 and 92 may receive light from both the red and red complement lenses. Therefore, this region is not normally used as part of the active imaging area. Pixel sensors 70 from this region may be removed to make room for other circuits, but because of the relatively small percentage of area lost and the flexibility to use the entire 64×80 pixel array in other applications, leaving pixel sensors 70 in the region bordered by lines 90 and 92 may be of greater benefit. Also, it is not convenient to interrupt the signal paths along the columns in the array. In the exemplary embodiment, less than 8.5% of pixel sensors 70 falls between lines 90 and 92. An embodiment limiting the width required between lines 90 and 92 is described with regards to FIG. 5 below. The red and red complement lenses are described with regards to FIGS. 3 through 6 and FIG. 8 below.

In an embodiment of the present invention, pixel sensors 70 lying between left edge 76 and line 82 are used for headlamp on/off control. This use is described with regards to FIG. 8 below.

In another embodiment of the present invention, image sensor 34 is divided into more than two subwindows for imaging scene 24 into a plurality of color components. For example, upper subwindow 94 and lower subwindow 96 may each be split into two subwindows, creating four subwindows. The multiple subwindows may be arranged in a two-by-two grid or a one-by-four grid. Spacing between subwindows allows for vertical and horizontal adjustment.

Pixel sensors 70 in image sensor 34 may be charge-coupled devices, photodiodes, or the like. In a preferred embodiment, pixel sensors 70 are CMOS active pixel sensors. An APS image sensor is described in U.S. Pat. No. 6,008,486 entitled "WIDE DYNAMIC RANGE OPTICAL SENSOR," issued Dec. 28, 1999, which is hereby incorporated by reference.

Figure 3:
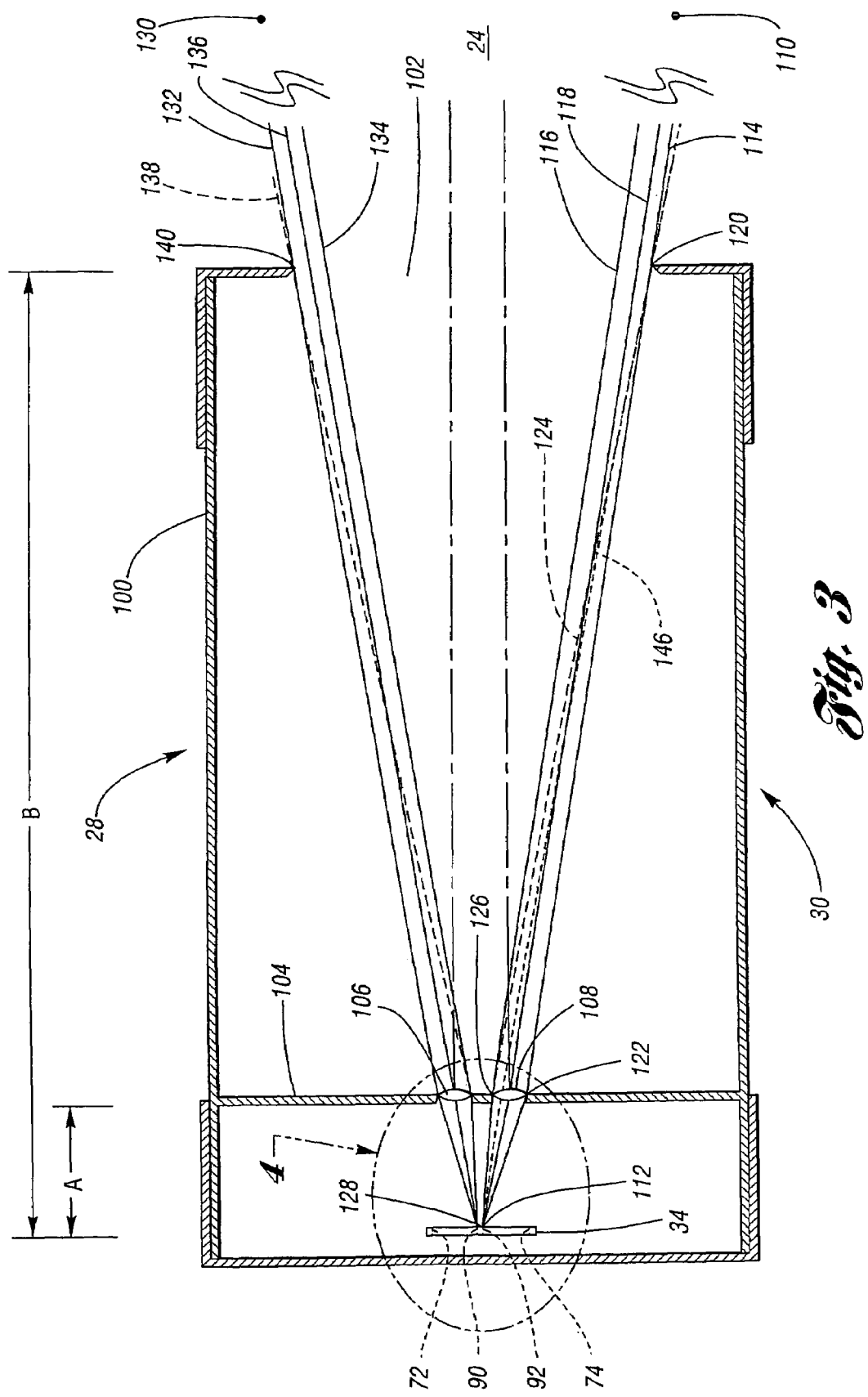
FIG. 3 is an optical system according to the present invention.

Referring now to FIG. 3, an illustrative embodiment of the present invention is shown. Imaging system 28 includes housing 100 with opening 102 opening towards scene 24. Image sensor 34 is located within housing 100 opposite of opening 102. Support member 104 is located within housing 100 and holds red lens 106 and red complement lens 108 between image sensor 34 and opening 102. The support member 104 includes a first aperture for the first lens and a second aperture for the second lens. Support 104 also prevents light coming through opening 102 from striking image sensor 34 unless the light passes through red lens 106 or red complement lens 108. The range of pixel sensors 70 used to form top subwindow 94, namely top edge 72 and line 90, as well as to form bottom subwindow 96, namely bottom edge 74 and line 92, is indicated on image sensor 34.

Preferably, opening 102 is located several focal lengths of lenses 106, 108 in front of lenses 106, 108. Opening 102 is characterized to minimize the distance between the borders of two images separately projected onto image sensor 34, reducing the amount of optical crosstalk between upper subwindow 94 and lower subwindow 96. This is accomplished by using one border of opening 102 positioned to block light which would otherwise travel through lens 108 and impinge as stray light on upper subwindow 94. Likewise, another border of opening 102 is positioned to block light which would otherwise travel through lens 106 and impinge as stray light on lower subwindow 96. The use of opening 102 to limit optical crosstalk is described with regards to FIG. 4 below. A further improvement is to incorporate a baffle positioned between the lens systems 106, 108 and extending towards image sensor 34 to further reduce the distance required between upper subwindow 94 and lower subwindow 96 to adequately minimize optical crosstalk. The use of a baffle is described with regards to FIG. 5 below. As a further extension, a light collecting optical system is placed in a portion of opening 102 so that a usable image is projected into a third region of image sensor 34 while maintaining adequate optical separation between the three images. The light collecting optical system and its application is described in FIGS. 7 and 8 below. Red lens 106 and red complement lens 108 are shown conceptually. An embodiment of the shape and further operation of red lens 106 and red complement lens 108 are described with regards to FIG. 6 below.

In an embodiment of the present invention, optical system 30 includes more than two lens systems 106, 108 to project a plurality of color filtered images of scene 24 onto image sensor 34. For example, four lenses can be arranged in a two-by-two array of lenses. Three of the lenses may pass light in a different color band, such as red, green, and blue, for true color imaging. The fourth lens may pass substantially unfiltered light for low light level imaging.

Figure 4:
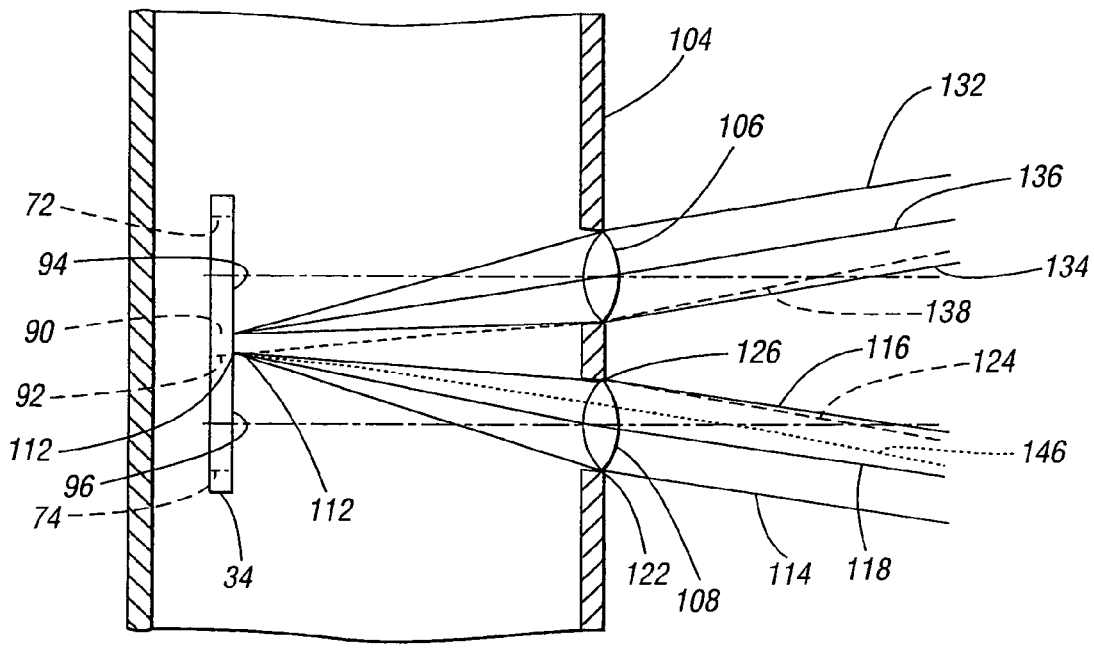
FIG. 4 is an enlarged portion of the optical system shown in FIG. 3.

Referring now to FIGS. 3 and 4, the operation of image system 28 will now be described. Low point 110 represents a distant point in scene 24 which is projected as point 112 onto image sensor 34. Low point 110 is at the lower extent of the field of view and projects onto point 112 at the upper extent of lower subwindow 96 as indicated by line 92 of the unobstructed portion of the image projected by a red complement lens 108. Since low point 110 is a distance of typically 50 to 200 meters away for headlamps of oncoming vehicles and tail lights of rearwardly approached vehicles when most headlamp controller actions are initiated, light rays 26 indicated by lower light ray 114, upper light ray 116, and central light ray 118 are nearly parallel prior to striking red complement lens 108. Red complement lens 108 focuses lower ray 114, upper ray 116, and central ray 118 into point 112 on image sensor 34. Lower aperture edge 120 of opening 102 is positioned so that lower ray 114 just clears lower aperture edge 120 and the lower edge of red complement lens 108 indicated by 122. With this arrangement, opening 102 is just large enough not to block light from low point 110 which would otherwise fall on red complement lens 108 to be focused on point 112.

Ray 124 is the most upwardly directed ray which will clear lower aperture edge 120 and pass through red complement lens 108. Compared to ray 114, ray 124 traverses a path which is angled upward by an increasing amount so that it is higher by one lens diameter than ray 114 when it enters red complement lens 108 at the top of lens 108 indicated by 126. This angular deviation of ray 124 from parallel rays 114, 116, and 118 is approximately preserved as ray 124 leaves red complement lens 108. Ray 124 strikes image sensor 34 at lower boundary 90 of upper side window 94 at a point indicated by 128.

In one embodiment, red lens 106 and red complement lens 108 have an F number of 4, are nominally 1 millimeter in diameter, and have a focal length, dimension A, of 4 millimeters. Opening 102 is 6 focal lengths from red lens 106 and red complement lens 108. Dimension B for housing 100 is about 28 millimeters.

One of the advantages of miniaturization is that opening 102 can be spaced a reasonably large number of focal lengths from red lens 106 and red complement lens 108 without incurring an excessively large structure. The farther opening 102 is from lenses 106 and 108, the more distance between lines 90 and 92 can be reduced so that the choice of spacing from opening 102 to lenses 106 and 108 is a practical matter of balancing size against lost sensing area.

For the illustrative embodiment described above, ray 124 travels one-sixth as far from red complement lens 108 to image sensor 34 as from opening 102 to red complement lens 108. Therefore, ray 124 strikes image sensor 34 at a point which is approximately one-sixth the diameter of red complement lens 108 above point 112.

High point 130 is at the upper extent of the field of view of scene 24. The projection of high point 130 through red complement lens 108 strikes image sensor 34 at a point lower than the region covered by lower subwindow 96. These rays are not depicted since the projected image is not within either subwindow 94 or 96.

Since high point 130 is also distant from opening 102, upper ray 132, lower ray 134, and middle ray 136 are substantially parallel prior to striking red lens 106. Red lens 106 focuses rays 132, 134, and 136 onto point 128 on image sensor 34 at the lower boundary of upper subwindow 94 as marked by line 90. As with ray 124 described above, ray 138 is the most downwardly directed ray which can pass upper opening edge 140 and still be focused by red lens 106, striking image sensor 34 at point 112. Thus, while the stray light from red complement lens 108 diminishes to substantially zero in going from line 92 to line 90, the stray light from red lens 106 diminishes to substantially zero in going from line 90 to line 92.

Figure 5:
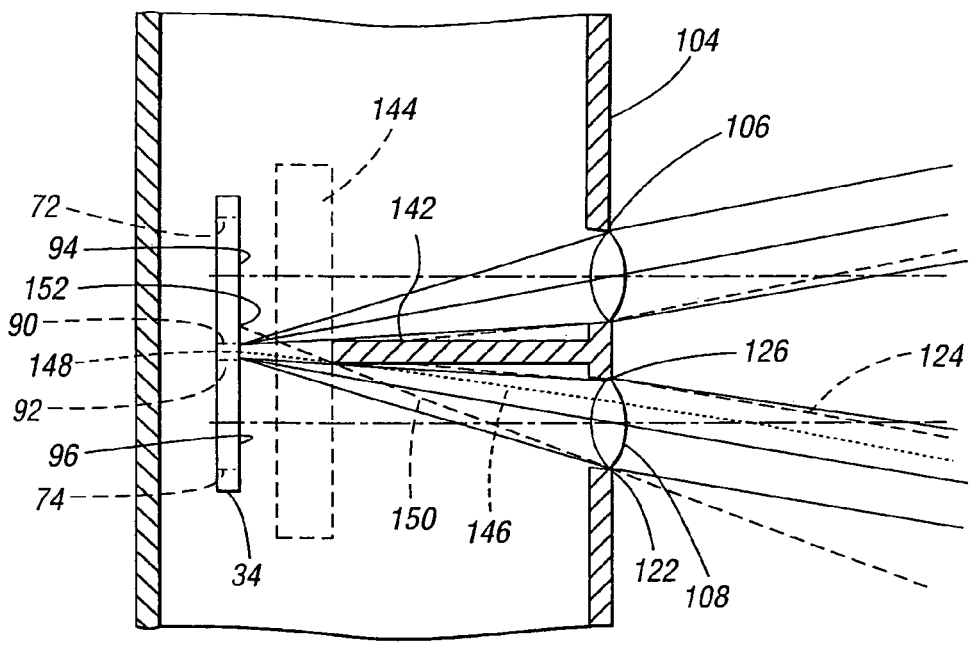
FIG. 5 is an alternative embodiment of an imaging system including a baffle according to the present invention.

Referring now to FIG. 5, an alternative embodiment of the present invention is shown. FIG. 5 shows the same area of imaging system 28 as seen in FIG. 4. The embodiment depicted in FIG. 5 is the same as depicted in FIG. 4 with the exception of the addition of baffle 142. Baffle 142 decreases the region of image sensor 34 onto which light from both red lens 106 and red complement lens 108 can strike.

As a simplified generalization, for a lens at infinity focus and aperture of diameter d, a stop or baffle which is n focal lengths in front of the lens can be positioned to block rays which would strike the focal plane at a distance of more than d/n away from the portion of the image which is unaffected by the stop.

Baffle 142 extends substantially perpendicular to support 104 towards image sensor 34. Ideally, baffle 142 would extend until nearly touching image sensor 34. However, image sensor 34 may include sensor package cover glass 144 which may limit the extension of baffle 142.

Baffle 142 blocks ray 124 from striking image sensor 34. With baffle 142 in place, ray 146 represents the lowest ray which will clear lower opening edge 120, pass through red complement lens 108, and strike image sensor 34 at point 148. Point 148 is about two-thirds of the distance from line 92 to line 90.

Ray 150 is the most upwardly directed ray which could be focused through red complement lens 108 and onto image sensor 34 in the absence of lower opening edge 120. Ray 150 strikes image sensor 34 at a point indicated by 152 well into the area reserved for the image from red lens 106.

There is little room for good optical treatment of baffle 142 and rays such as 124 which strike baffle 142 at a shallow angle will reflect significantly even from the most blackened surfaces. Opening 102 in front of lenses 106 and 108 performs much better than baffle 142 in the exemplary embodiment shown, but the combination of opening 102 and baffle 142 gives the best performance in minimizing the distance separating upper subwindow 94 and lower subwindow 96 to prevent a significant amount of light which enters one of lens 106 or 108 from falling onto the subwindow projected by the other lens. Note that, instead of spacing subwindows 94 and 96 by the distance between lines 90 and 92, this distance could be reduced by applying a baffle similar to baffle 142 but thinner, by the reduction of subwindow spacing, and by recentering lenses 106 and 108 and resizing opening 102.

Figure 6:
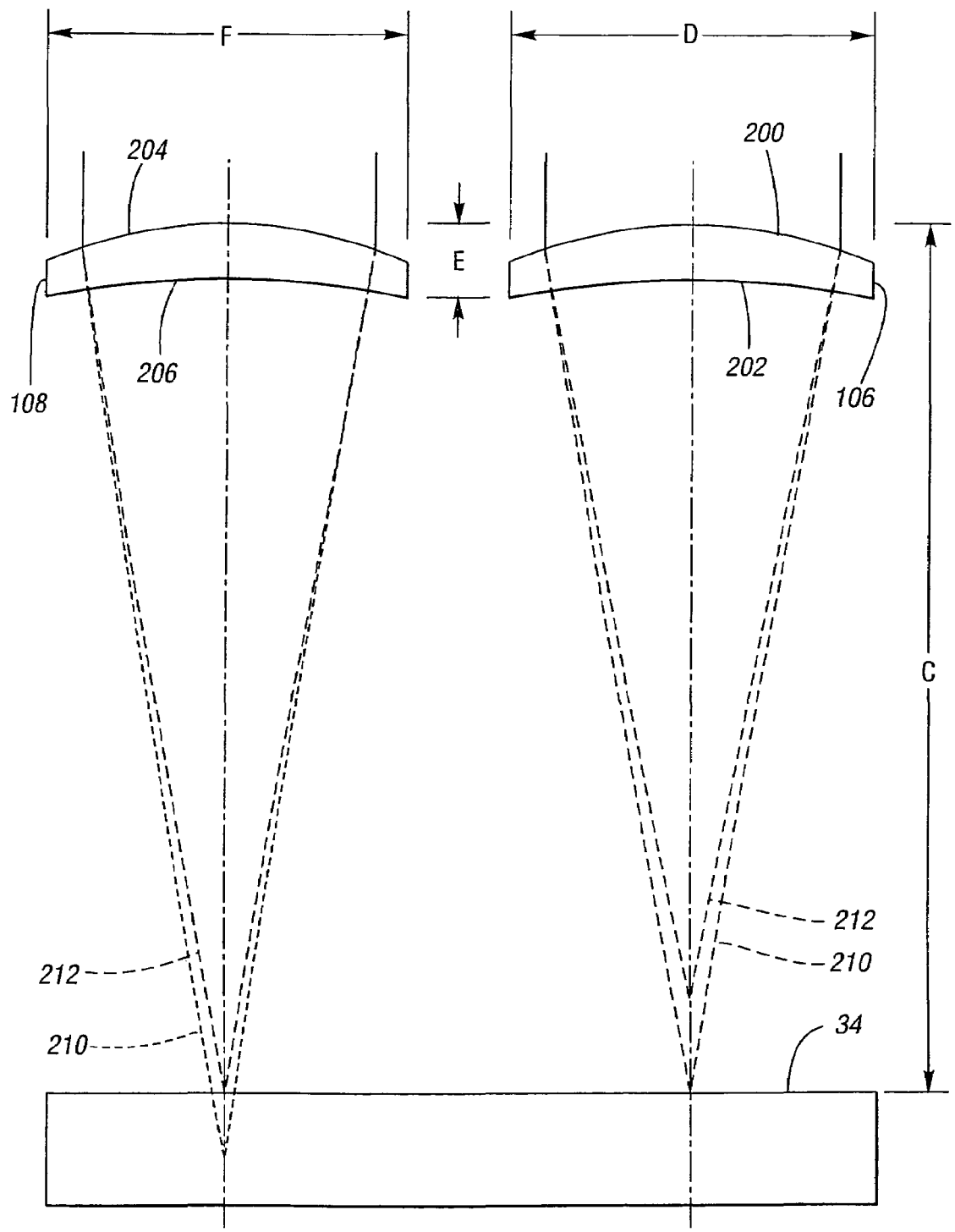
FIG. 6 is a schematic diagram illustrating the operation of two lenses for an embodiment of the present invention.

Referring now to FIG. 6, an exemplary embodiment of an aspherical lens pair for use in the present invention is shown. The drawing is provided to illustrate operation of the lenses and not to represent the precise shape or positioning of the lenses.

Red lens 106 has front surface 200 facing away from image sensor 34 and back surface 202 facing towards image sensor 34. At its farthest point, front surface 204 is located dimension C of 4.25 millimeters from image sensor 34. Front surface 200 is an ellipsoid described by Equation 1:

$$Z = \frac{cr^2}{1 + \sqrt{1-(1+k)c^2r^2}} + \sum_{n=2}^{10} C_{2n} r^{2n}$$

where Z is the value of the height of the lens surface along the optical axis as a function of the radial distance r from the optical axis, c is the curvature, k is the conic constant, and the coefficients $C_{2n}$ are the even order polynomial coefficients. For front surface 200, c equals 0.7194 and k equals −0.4529. Rear surface 202 is spherical with a radius of 4.05 millimeters. The diameter of red complement lens 108, shown as dimension D, is 1.2 millimeters. Red complement lens 108 has a thickness, shown as dimension E, of 0.2 millimeters at its center. The focal length of red lens 106 is frequency dependent and is 4.25 millimeters for a wavelength of 680 nanometers.

Red complement lens 108 has front surface 204 facing away from image sensor 34 and rear surface 206 facing towards image sensor 34. At its farthest point, front surface 200 is located dimension C of 4.25 millimeters from image sensor 34. Front surface 204 is also an ellipsoid described by Equation 1 with curvature c equal to 0.7059 and conic constant k equal to −0.4444. Rear surface 206 is spherical with a radius of 4.05 millimeters. The diameter of red complement lens 108, shown as dimension F, is 1.2 millimeters. Red complement lens 108 has a thickness, shown as dimension E, of 0.2 millimeters at its center. The focal length of red complement lens 108 is frequency dependent and is 4.25 millimeters for a wavelength of 420 nanometers.

Referring again to FIG. 6, the effects of frequency dependent focal lengths in lenses 106 and 108 are described. Due to the different aspherical front surfaces of red lens 106 and red complement lens 108, red light rays 210 and blue light rays 212 are focused differently through each lens. The focal point for red light rays 210 passing through red lens 106 is at the surface of image sensor 34 whereas blue light rays 212 passing through red lens 106 focus a distance in front of image sensor 34. Likewise, blue light rays 212 passing through red complement lens 108 focus onto the surface of image sensor 34 and red light rays 210 passing through red complement lens 108 focus a distance behind the surface of image sensor 34.

In a preferred embodiment, red lens 106 is manufactured from a polymer which includes a dye for reducing the magnitude of red complement light transmitted through red lens 106. Red complement lens 108 is manufactured from a polymer which includes a dye for reducing the magnitude of red light transmitted through red complement lens 108. As an alternative, at least one surface of red lens 106 and red complement lens 108 may be coated to achieve red filtering and red complement filtering, respectively. A further alternative is to use separate filters between scene 24 and image sensor 34. In particular, filters may be attached to support 104 either directly in front of or in back of lenses 106 and 108.

In an embodiment of the present invention, more than two lenses 106, 108 are used. Each lens may be dyed or tinted to emit a different color frequency. Preferably, each lens is shaped such that the focal length of any lens 106, 108 at the pass frequency of that lens is the same as the focal length of any other lens 106, 108 at the pass frequency of the other lens.

Figure 7:
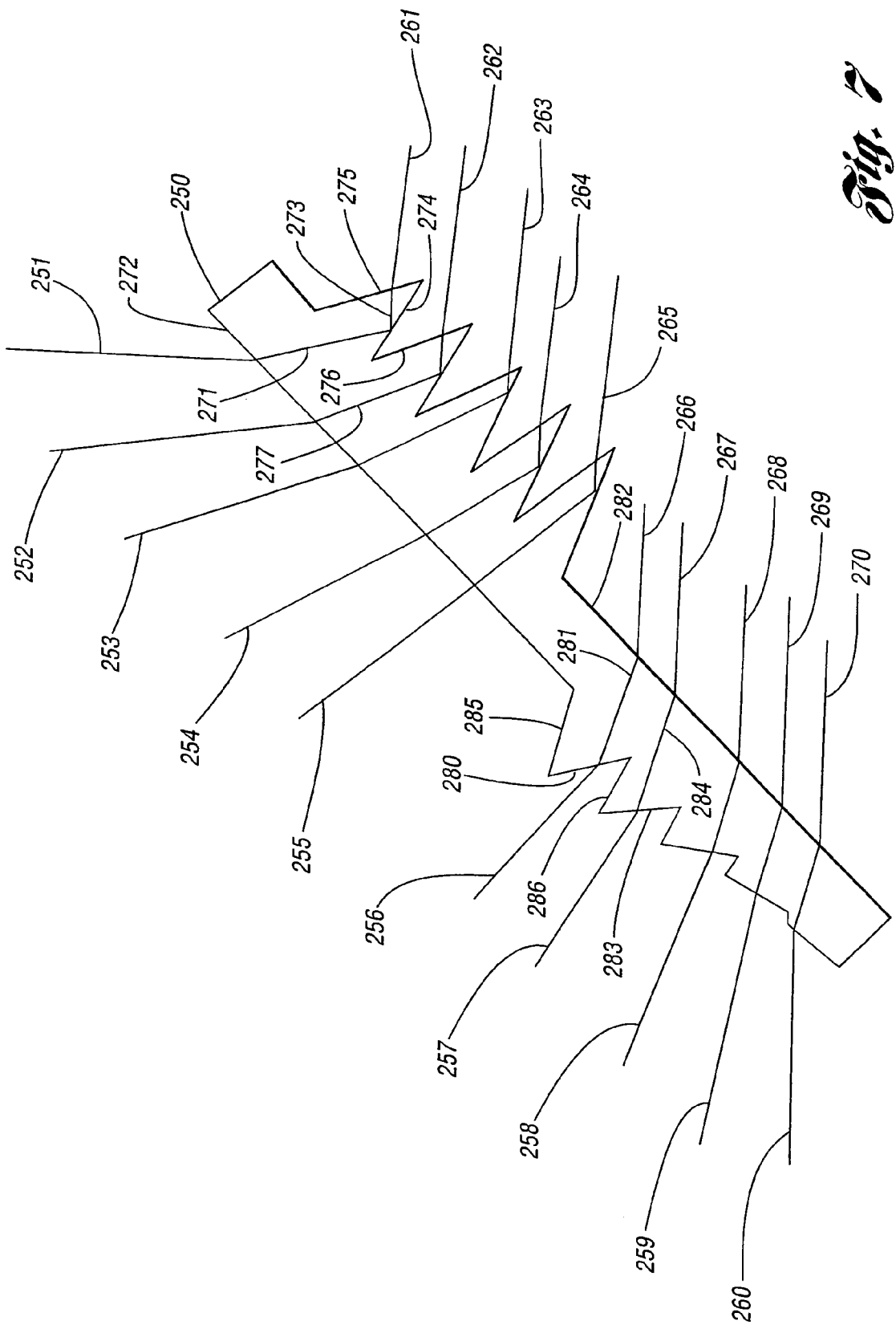
FIG. 7 is a lens for use in an embodiment of the present invention for headlamp on/off control.

Referring now to FIG. 7, a lens for use in an embodiment of the present invention for headlamp on/off control is shown. Light sampling lens 250 collects light from a range of directions, shown as rays 251 through 260, from the horizontally forward direction to the vertically upward direction. The inclinations of rays 251 through 260 are spaced in approximately 10° increments. Lens 250 redirects incoming rays 251 through 260 to outgoing rays 261 through 270 along approximately horizontal paths.

Approximately vertical ray 251 is refracted to ray 271 at front surface 272 of lens 250. Ray 271 is internally reflected to ray 273 at surface 274 and ray 273 is refracted to ray 261. Surface 275 is approximately parallel to ray 271 or is at an angle with surface 274 slightly larger than the angle which would place surface 275 parallel to ray 271. If surface 275 is at an angle with surface 274 less than the angle which would place surface 275 parallel to ray 271, ray 271 would be blocked when ray 251 entered at a higher point on surface 272, thereby casting an objectionable shadow on surface 274 close to the intersection of ray 271 with surface 275. Lens 250 bends incoming rays 252 through 255 in a similar manner to produce outgoing rays 262 through 265. Surface 274 forms the lower side and surface 275 forms the upper side of a triangular feature with a vertex pointing generally away from front surface 272.

Ray 256 is refracted at surface 280 to ray 281 and ray 281 is refracted to ray 266 at back surface 282. Similarly, ray 257 is refracted by surface 283 to become ray 284, which is refracted by back surface 282 to become ray 267. Surface 285 is approximately parallel to ray 281 and surface 286 is oriented to approximately bisect the angle between ray 256 and ray 284. Lens 250 refracts incoming rays 258 through 260 in a similar manner to produce outgoing rays 268 to 270. Surface 280 forms the lower side and surface 285 forms the upper side of a triangular feature with a vertex pointing generally away from back surface 282.

In a preferred embodiment of lens 250, outgoing rays 261 through 270 are angled progressively from slightly downward for ray 261 to slightly upward for ray 270.

In one embodiment, lens 250 is formed from acrylic with a cross section as shown in FIG. 7 throughout. This embodiment will collect light in a vertically oriented 90° fan with a relatively small angle in the horizontal direction. In an alternative embodiment, increased horizontal coverage is obtained by modifying front surface 272 and back surface 282. Surface 272 can be formed with a concave cylindrical shape, with the axis of the cylinder parallel to the length of lens 250. Surface 282 can be formed with a negative cylindrical shape, the axis of the cylinder again parallel to the length of lens 250.

Referring now to FIG. 8, an illustrative optical system incorporating the lens of FIG. 7 is shown. Baffle 300 is placed between scene 24 and lenses 106 and 108. In a preferred embodiment, baffle 300 is part of housing 100. Baffle 300 is angled at an angle θ of approximately 45° with vehicle horizontal. Baffle 300 defines opening 302 opening towards scene 24 in front of the vehicle. Opening 302 may be trapezoidal such that the projection of aperture 302 onto a vertical surface would form a rectangle on the vertical surface similar to aperture 102. Aperture 302 is as small as possible without restricting light projected by lens 106 to any point in upper subwindow 94 or by lens 108 to any point in lower subwindow 96.

Lens 250 is mounted in one side of opening 302. The width of lens 250 is approximately the same as the diameter of lens 106 or 108. Lens 250 is oriented such that ray 251 comes from approximately above the vehicle and ray 260 comes from approximately in front of the vehicle. Lens 250 is positioned so that a blurred, inverted image of lens 250 is projected by red lens 106 onto one edge of image sensor 34 between line 304 and line 306 to form red sky image 312. Lens 250 is also positioned so that a blurred, inverted image of lens 250 is projected by red complement lens 108 onto one edge of image sensor 34 between line 308 and line 310 to form red complement sky image 314. Due to parallax error, line 306 is above the lower edge of upper subwindow 94 and line 308 is below lower subwindow 96. The active length of lens 250 is made short enough to permit the entire active length to be projected on the regions between lines 304 and 306 and between lines 308 and 310.

Red sky image 312 and red complement sky image 314 are scanned into processing and control system 36. Since only a coarse image is required for headlamp on/off control, it is not a great detriment that red sky image 312 and red complement sky image 314 are not in focus. In one embodiment, a threshold is compared to the light levels detected by image sensor 34. If the light levels are above the threshold, headlamp 22 is turned off. If the light levels are below the threshold, headlamp 22 is turned on.

The pixel locations for red sky image 312 and red complement sky image 314 are correlated so that readings can be compared for each 10° elevational increment. A higher ratio of red complement indicates that blue sky is being viewed. In one embodiment, a lower threshold point may be used to turn headlamp 22 on or off for a blue sky than for a cloudy sky.

In another embodiment, the threshold is hysteretic. In still another, a time delay after the last on/off transition is used. These two embodiments may prevent headlamp 22 from frequent on/off transitions around the switch point.

While the best modes for carrying out the invention have been described in detail, other possibilities exist within the spirit and scope of the present invention. Those familiar with the art to which this invention relates will recognize various alternative designs and embodiments for practicing the invention as defined by the following claims.

The invention claimed is:

1. A vehicular vision system for mounting in a vehicle, comprising:
   an image sensor comprising an array of pixel sensors and an image plane;
   a housing having an opening, said opening being in a fixed position relative to the vehicle;
   a lens component positioned in said housing behind said opening such that said opening blocks some light that would otherwise be incident upon said lens component to thereby limit a field of view of said image sensor; and a means for distinguishing a blue sky from a cloudy sky, said means for distinguishing a blue sky from a cloudy sky comprising a spectral filter material located between at least a portion of said image plane and a scene to be imaged.

2. A vehicular vision system as in claim 1 further comprising a lower threshold point to turn on and, or, off a vehicle light for a blue sky than for a cloudy sky.

3. A vehicular vision system as in claim 1 further comprising a controller configured to generate an exterior light control signal as a function of at least one image.

4. A vehicular vision system as in claim 1, wherein said lens component comprises at least two lenses each for gathering light rays from a region substantially in front of a vehicle and focusing the gathered light rays on said image sensor, each of said lenses is associated with a different spectral band.

5. A vehicular vision system as in claim 1 configured in at least one vehicle system selected from the group comprising: an automatic exterior light control and a moisture sensor.

6. A vehicular vision system for mounting to a vehicle, comprising:
   an image sensor comprising an array of pixel sensors and an image plane;
   a housing having an opening, said opening being in a fixed position relative to the vehicle;
   a lens component positioned in said housing behind said opening such that said opening blocks some light that would otherwise be incident upon said lens component to thereby limit a field of view of said image sensor; and
   a means for distinguishing a blue sky from a cloudy sky.

7. A vehicular vision system as in claim 6 further comprising a lower threshold point to turn on and, or, off a vehicle light for a blue sky than for a cloudy sky.

8. A vehicular vision system as in claim 6, said means for distinguishing a blue sky from a cloudy sky comprising at least one lens configured to project at least a portion of a scene of the sky onto said image sensor such that a portion of associated light rays passes through a spectral filter.

9. A vehicular vision system as in claim 6 further comprising a controller configured to generate an exterior light control signal as a function of at least one image.

10. A vehicular vision system as in claim 6, wherein said lens component comprises at least two lenses each for gathering light rays from a region substantially in front of a vehicle and focusing the gathered light rays on said image sensor, each of said lenses is associated with a different spectral band.

11. A vehicular vision system as in claim 6 configured in at least one vehicle system selected from the group comprising: an automatic exterior light control and a moisture sensor.

* * * * *

UNITED STATES PATENT AND TRADEMARK OFFICE
CERTIFICATE OF CORRECTION

PATENT NO. : 7,408,136 B2 Page 1 of 1
APPLICATION NO. : 11/143150
DATED : August 5, 2008
INVENTOR(S) : Jon H. Bechtel et al.

It is certified that error appears in the above-identified patent and that said Letters Patent is hereby corrected as shown below:

Title page, item [54] and col. 1 "VEHICLE VISION BASED SYSTEMS HAVING IMPROVED LIGHT SOURCE DISTINGUISHING FEATURES" and should read -- VEHICLE VISION BASED SYSTEMS HAVING IMPROVED TAIL LIGHT DISTINGUISHING FEATURES --.

Signed and Sealed this

Fourteenth Day of October, 2008

JON W. DUDAS
*Director of the United States Patent and Trademark Office*